(12) United States Patent
Jung

(10) Patent No.: US 8,421,103 B2
(45) Date of Patent: Apr. 16, 2013

(54) SEMICONDUCTOR LIGHT EMITTING DEVICE AND LIGHT EMITTING DEVICE PACKAGE INCLUDING THE SAME

(75) Inventor: Joo Yong Jung, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 376 days.

(21) Appl. No.: 12/707,312

(22) Filed: Feb. 17, 2010

(65) Prior Publication Data

US 2010/0207153 A1   Aug. 19, 2010

(30) Foreign Application Priority Data

Feb. 18, 2009   (KR) .................. 10-2009-0013605

(51) Int. Cl.
*H01L 33/00* (2010.01)
(52) U.S. Cl.
USPC ........ 257/98; 257/99; 257/100; 257/E33.059; 257/E33.062
(58) Field of Classification Search .............. 257/98
See application file for complete search history.

(56) References Cited

U.S. PATENT DOCUMENTS

| | | | | |
|---|---|---|---|---|
| 5,371,404 A * | 12/1994 | Juskey et al. | ................. | 257/659 |
| 5,814,837 A * | 9/1998 | Okazaki | ......................... | 257/91 |
| 6,597,717 B1 * | 7/2003 | Kneissl et al. | ............. | 372/46.01 |
| 6,869,820 B2 * | 3/2005 | Chen | ................................ | 438/79 |
| 7,488,622 B2 * | 2/2009 | Bogner et al. | ................ | 438/123 |
| 7,538,360 B2 * | 5/2009 | Fudeta et al. | .................. | 257/99 |
| 7,667,239 B2 * | 2/2010 | Pang et al. | ....................... | 257/98 |
| 7,824,937 B2 * | 11/2010 | Suehiro et al. | .................. | 438/26 |
| 8,039,281 B2 * | 10/2011 | Jang et al. | ....................... | 438/29 |
| 2002/0030194 A1 * | 3/2002 | Camras et al. | .................. | 257/98 |
| 2004/0140474 A1 * | 7/2004 | Ueda et al. | ....................... | 257/79 |
| 2005/0199893 A1 * | 9/2005 | Lan et al. | ......................... | 257/94 |
| 2006/0065905 A1 | 3/2006 | Eisert et al. | | |
| 2006/0091409 A1 * | 5/2006 | Epler et al. | ....................... | 257/95 |
| 2007/0023769 A1 * | 2/2007 | Nishimoto et al. | ............. | 257/88 |
| 2007/0042520 A1 | 2/2007 | Oh et al. | | |
| 2007/0181891 A1 | 8/2007 | Eisert et al. | | |
| 2007/0200122 A1 * | 8/2007 | Kim et al. | ........................ | 257/79 |
| 2008/0122084 A1 * | 5/2008 | Hwang et al. | .................. | 257/737 |
| 2008/0169482 A1 * | 7/2008 | Kang | ................................ | 257/98 |
| 2008/0237631 A1 * | 10/2008 | Watanabe | ...................... | 257/141 |
| 2008/0283846 A1 * | 11/2008 | Ohmae et al. | .................... | 257/79 |
| 2009/0008661 A1 * | 1/2009 | Arimitsu | ........................... | 257/96 |
| 2009/0023015 A1 * | 1/2009 | Hiramatsu | ................... | 428/690 |
| 2009/0039379 A1 | 2/2009 | Shiraishi et al. | | |
| 2009/0051024 A1 * | 2/2009 | Chia | ............................. | 257/686 |

(Continued)

FOREIGN PATENT DOCUMENTS

| | | |
|---|---|---|
| CN | 101313416 A | 11/2008 |
| EP | 0590232 A1 | 4/1994 |

(Continued)

*Primary Examiner* — N Drew Richards
*Assistant Examiner* — Ankush Singal
(74) *Attorney, Agent, or Firm* — Birch, Stewart, Kolasch & Birch, LLP

(57) ABSTRACT

A semiconductor light emitting device is provided. The semiconductor light emitting device comprises a plurality of compound semiconductor layers, an electrode layer, a conductive support member and a first buffer member. The compound semiconductor layers comprise a first conductive semiconductor layer, an active layer and a second conductive semiconductor layer. The electrode layer is disposed under the plurality of compound semiconductor layers. The conductive support member is disposed under the electrode layer. The first buffer member is embedded to be spaced apart, in the conductive support member.

19 Claims, 13 Drawing Sheets

U.S. PATENT DOCUMENTS

| | | |
|---|---|---|
| 2009/0072708 A1* | 3/2009 | Tamaki et al. .................. 313/503 |
| 2009/0127621 A1* | 5/2009 | Lee ................................. 257/347 |
| 2009/0152581 A1 | 6/2009 | Kishimoto et al. |
| 2010/0127297 A1* | 5/2010 | Jeong ............................... 257/98 |

FOREIGN PATENT DOCUMENTS

| | | |
|---|---|---|
| EP | 2023699 A2 | 2/2009 |
| KR | 10-0706951 B1 | 4/2007 |
| KR | 10-2007-0082278 A | 8/2007 |
| KR | 10-2008-0088278 A | 10/2008 |
| KR | 10-2008-0093557 A | 10/2008 |
| KR | 10-2009-0004044 A | 1/2009 |
| WO | WO-2004/032247 A2 | 4/2004 |
| WO | WO-2008/123765 A1 | 10/2008 |

* cited by examiner

SEMICONDUCTOR LIGHT EMITTING DEVICE AND LIGHT EMITTING DEVICE PACKAGE INCLUDING THE SAME

CROSS-REFERENCE TO RELATED APPLICATIONS

The present application claims priority under 35 U.S.C. 119 to Korean Patent Application No. 10-2009-0013605 (filed on Feb. 18, 2009), which is hereby incorporated by reference in its entirety.

BACKGROUND

The present disclosure relates to a semiconductor light emitting device and a light emitting device package having the same.

Group III-V nitride semiconductors have been variously applied to an optical device such as blue and green Light Emitting Diodes (LED), a high speed switching device such as a Metal Oxide Semiconductor Field Effect Transistor (MOSFET), a High Electron Mobility Transistor (HEMT) and a Hetero junction Field Effect Transistor (HFET), and a light source of a lighting device or a display device.

The nitride semiconductor is mainly used for the LED or a Laser Diode (LD), and studies have been continuously conducted to improve the manufacturing process or light efficiency of the nitride semiconductor.

SUMMARY

Embodiments provide a semiconductor light emitting device, which can prevent the contortion of a wafer.

Embodiments provide a semiconductor light emitting device, which includes a first buffer member in a conductive support member disposed under a compound semiconductor layer.

Embodiments provide a light emitting device package including a light emitting device having a first buffer member in a conductive support member.

An embodiment provides a semiconductor light emitting device comprising: a plurality of compound semiconductor layers comprising a first conductive semiconductor layer, an active layer and a second conductive semiconductor layer; an electrode layer under the plurality of compound semiconductor layers; a conductive support member under the electrode layer; and a first buffer member embedded to be spaced apart, in the conductive support member.

An embodiment provides a semiconductor light emitting device comprising: a plurality of compound semiconductor layers comprising a first conductive semiconductor layer, an active layer and a second conductive semiconductor layer; an electrode layer disposed under the plurality of compound semiconductor layers, and electrically connected to the second conductive semiconductor layer; an electrode electrically connected to the first conductive semiconductor layer; a conductive support member under the electrode layer; and a first buffer member arranged in the conductive support member to have a height equal to or less than a thickness of the conductive support member.

An embodiment provides a semiconductor light emitting device package comprising: a body; a plurality of lead electrodes in the body; a light emitting device electrically connected to the plurality of lead electrodes; and a molding member covering the light emitting device, wherein the light emitting device comprises: a plurality of compound semiconductor layers comprising a first conductive semiconductor layer, an active layer and a second conductive semiconductor layer; an electrode layer under the plurality of compound semiconductor layers; a conductive support member under the electrode layer; and a first buffer member embedded to be spaced apart, in the conductive support member.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'. Moreover, any reference of the 'on' or 'under' of each layer will be described with reference to the accompanying drawings.

Figure 1:
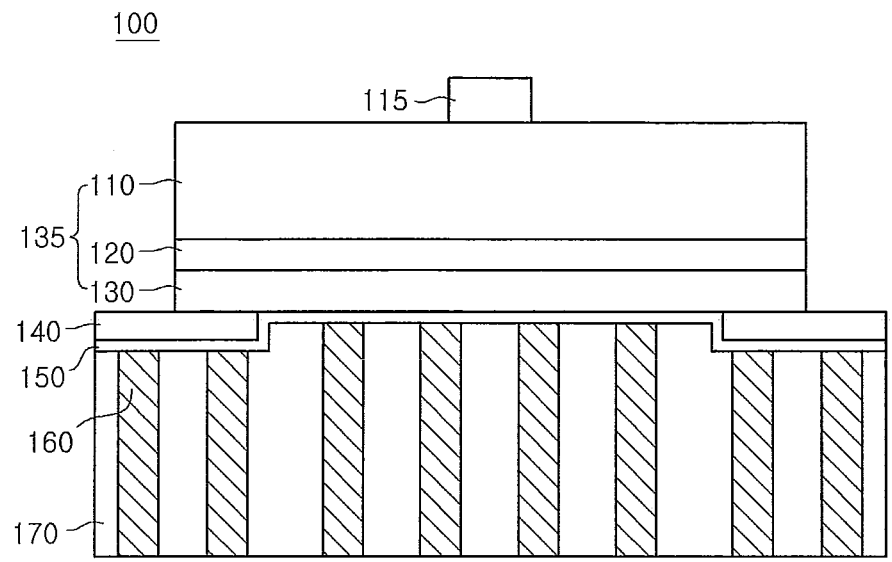
FIG. 1 is a side-sectional view of a semiconductor light emitting device according to one embodiment.

FIG. 1 is a side-sectional view of a semiconductor light emitting device according to one embodiment.

Referring to FIG. 1, a semiconductor light emitting device 100 according to one embodiment includes a plurality of compound semiconductor layers 135, a channel layer 140, an electrode layer 150, a first buffer member 160, a conductive support member 170, and an electrode 115.

The plurality of compound semiconductor layers 135 are formed of the compound semiconductor of group III-V elements, and include a first conductive semiconductor layer 110, an active layer 120 and a second conductive semiconductor layer 130.

The first conductive semiconductor layer 110 may be formed of an N-type semiconductor on which a first conductive dopant is doped. The N-type semiconductor may consist of any one of compound semiconductors such as GaN, InN, AlN, InGaN, AlGaN, InAlGaN and AlInN. As the N-type dopant, the first conductive dopant includes Si, Ge, Sn, Se and Te.

The active layer 120 is formed under the first conductive semiconductor layer 110, and the active layer 120 may be formed in a single quantum well structure or a multiple quantum well structure. The active layer 120, for example, may be formed in a single quantum well structure or a multiple quantum well structure for each period of an InGaN well layer/GaN barrier layer. In the active layer 120, the material of a quantum well layer and the material of a quantum barrier layer may be changed according to light emitting materials, but the active layer 120 is not limited thereto. A clad layer may be formed on or/and under the active layer 120.

The second conductive semiconductor layer 130 is formed under the active layer 120, and may be formed of a P-type semiconductor on which a second conductive dopant is doped. The P-type semiconductor may consist of any one of compound semiconductors such as GaN, InN, AlN, InGaN, AlGaN, InAlGaN and AlInN. As the P-type dopant, the second conductive dopant may include an element such as Mg, Be and Ze.

The first conductive semiconductor layer 110, the active layer 120 and the second conductive semiconductor layer 130 may be defined as a light emitting structure. A third conductive semiconductor layer having a opposite polarity to that of the second conductive semiconductor layer 130 is formed on the second conductive semiconductor layer 130, and the third conductive semiconductor layer (not shown) may be formed as an N-type semiconductor layer. Moreover, the first conductive semiconductor layer 110 may be formed of a P-type semiconductor, and the second conductive semiconductor layer 130 may be formed of an N-type semiconductor. Consequently, the light emitting structure may include any one of an N-P junction structure, a P-N junction structure, an N-P-N junction structure and a P-N-P junction structure. In the following description on one embodiment, the second conductive semiconductor layer 130 will be described as an example of the lowermost layer of the compound semiconductor layers 135.

The channel layer 140 may be formed at the lower-surface perimeter of the second conductive semiconductor layer 130. The channel layer 140 may be formed of a conductive material or an insulating material which selectively includes an oxide and a nitride, and may be formed of a material that is selected from among Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), $SiO_2$, $SiO_x$, $SiO_xN_y$, $Si_3N_4$, $Al_2O_3$ and $TiO_2$. The channel layer 140 may not be formed.

The electrode layer 150 is formed under the second conductive semiconductor layer 130. The electrode layer 150 may be formed of at least one of Ag, Ni, Al, Rh, Pd, Ir, Ru, Mg, Zn, Pt, Au, Hf and a material consisting of their selective combination. Moreover, the electrode layer 150 may be formed of a reflection electrode material having ohmic characteristic. A material having ohmic characteristic may be formed between the electrode layer 150 and the second conductive semiconductor layer 130 in a certain pattern, but it is not limited thereto.

The electrode layer 150 may be formed of an oxide or nitride-based conductive material, for example, may be formed of a material that is selected from among ITO, Indium Tin Oxide Nitride (ITON), IZO, Indium Zinc Oxide Nitride (IZON), IZTO, IAZO, IGZO, IGTO, AZO, ATO, GZO, $IrO_x$, $RuO_x$ and NiO.

The electrode layer 150 may serve as a current spreading layer that may spread a current. Moreover, the electrode layer 150 may be a reflection electrode layer, and may include a metal layer of a single-layer structure or a multiple-layer structure.

A current blocking layer may be formed between the electrode layer 150 and the second conductive semiconductor layer 130. The current blocking layer may be formed of a material that is an oxide or an insulating material and has lower conductivity than that of the material of the electrode layer 150. The current blocking layer is formed in a pattern form.

The conductive support member 170 may be formed under the electrode layer 150, and the conductive support member 170 may be formed of a material such as Cu, Au, Ni and Mo. The thickness of the conductive support member 170 may be formed to about 10 µm to about 300 µm.

The conductive support member 170 comprises a material having a thermal expansion coefficient of about Ni (Nickel) $13 \times 10^{-6}$/K, and Cu (Copper) $16 \times 10^{-6}$/K.

The first buffer member 160 is embedded together with a plurality of cores or wicks, in the conductive support member 170. The first buffer member 160 may be formed under the electrode layer 150 in a certain pattern. The first buffer member 160 may be formed by selectively using a material having certain stiffness, a refractory material and a nonconductive material, for example, may be formed of any one of $SiO_2$, $Si_3N_4$, $Al_2O_3$, $TiO_2$, $SiO_x$, $SiN_x2$, $SiN_x$, $SiO_xN_y$ and a photoresist. Moreover, the first buffer member 160 may be formed of a nonconductive material having a thermal expansion coefficient same to or similar to that of the conductive support member 170. The first buffer member 160 comprises a material having a thermal expansion coefficient less than a thermal expansion coefficient of the conductive support member 170.

The first buffer member 160 comprises a material having a thermal expansion coefficient of about $0.5 \sim 8 \times 10^{-6}$/K. The first buffer member 160 comprises a material having a Young's Modulus of about 72~390 Gpa.

The height of the insulating material 160 may be the same as the thickness of the conductive support member 170, or may be formed to have a length greater than about the 50% of the thickness of the conductive support member 170. The bottom of the first buffer member 160 may be exposed to a lower portion. The first buffer member 160 may have different heights according to a disposed region, but it is not limited thereto. Herein, the height of the first buffer member 160 may be determined with respect to the bottom of the conductive support member 170, or may be determined with respect to the bottom of the electrode layer 150.

The first buffer member 160 may be spaced apart to conformally be disposed at an entire region and be formed in a certain type of pattern. As illustrated in FIGS. 2 to 5, the pattern type of the first buffer member 160 may be formed in a dot matrix type using a pillar shape such as a circular pillar or a multi-angle pillar. Moreover, the first buffer member 160 may be formed in a stripe type using a plurality of bar types. The first buffer member 160 may be formed in a pattern (for example, a cross type or a line matrix type) that is crossed at least one time. Such a type may be modified.

The first buffer member 160 is disposed in the conductive support member 170 to have certain intervals. The first buffer member 160 perpendicularly passes through the conductive support member 170, and is arranged at regular or irregular intervals in a horizontal direction, in the conductive support member 170.

The first buffer member 160 may be formed to have intervals, which are greater than about 30 µm, between patterns. The interval may become broader in proportion to the thickness of the conductive support member 170. The pattern diameter of the first buffer member 160 may be formed to about 10 μm or greater.

The first buffer member 160 and the conductive support member 170 can provide certain stiffness to the lower portion of a Light Emitting Diode (LED) chip. For example, when a wire is bonded to the electrode 115, the first buffer member 160 and the conductive support member 170 prevent the LED chip from being bent by an impulse that is given to the electrode 115. Moreover, the first buffer member 160 can prevent the LED chip from being bent by heat that is generated in the LED chip, and can improve limitations in which the LED chip is broken or detached and thereby degrades chip characteristic.

FIGS. 2 to 5 are diagrams illustrating the pattern of a first buffer member according to embodiments.

Figure 2:
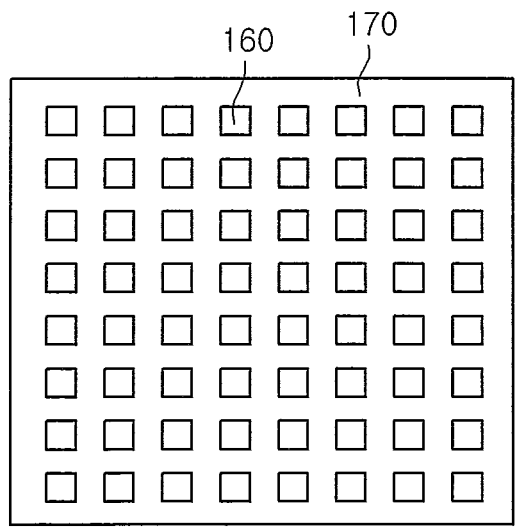
FIGS. 2 to 5 are diagrams illustrating the pattern of a first buffer member according to embodiments.

Referring to FIG. 2, the first buffer member 160 has a pattern, having a certain size and a tetragonal pillar shape, which is disposed at certain intervals inside the conductive support member 170, wherein the disposition of the pattern may be made at regular intervals or irregular intervals. Moreover, the first buffer member 160 may be arranged in a dot matrix type having a multi-angle pillar shape such as a triangular pillar and a tetragonal pillar.

Figure 3:
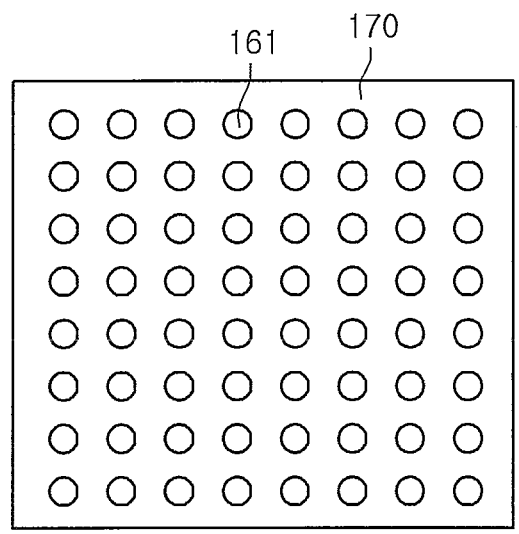

Referring to FIG. 3, a first buffer member 161 has a pattern, having a certain size and a circular pillar shape, which is disposed at certain intervals inside the conductive support member 170, wherein the disposition of the pattern may be made at regular intervals or irregular intervals. Moreover, the first buffer member 161 may be arranged in a dot matrix type having a pillar shape, which has a certain curvature, such as a circular pillar and an elliptical pillar.

Figure 4:
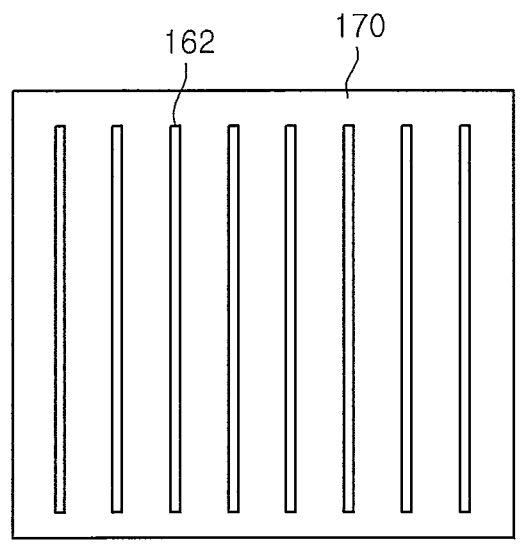

Referring to FIG. 4, a first buffer member 162 may be formed of a bar shapes having a certain size disposed in a stripe type inside the conductive support member 170, wherein the bar shapes may be formed at regular intervals or irregular intervals. Moreover, the cross-sectional surface of the first buffer member 162 may have a tetragonal pillar or a domed shape, but it is not limited thereto.

Figure 5:
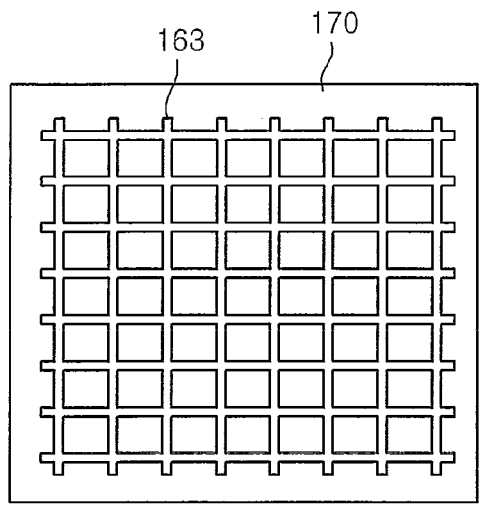

Referring to FIG. 5, the first buffer member 160 may be formed in a line matrix type where patterns having a certain length and a bar shape are perpendicularly crossed, inside the conductive support member 170. The patterns of the stripe type may be crossed perpendicularly or at a certain angle, but it is not limited thereto.

FIGS. 6 to 15 are diagrams illustrating a method for fabricating a semiconductor light emitting device according to one embodiment.

Figure 6:
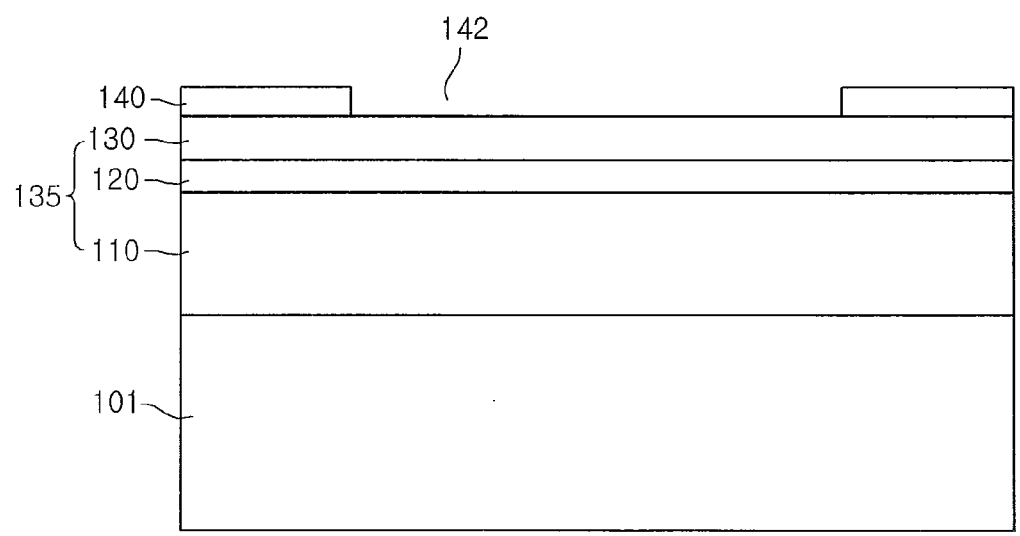
FIGS. 6 to 15 are diagrams illustrating a method for fabricating a semiconductor light emitting device according to one embodiment.

Referring to FIG. 6, a plurality of compound semiconductor layers 135 are formed on a substrate 101.

The substrate 101 may be selected from the group consisting of sapphire substrate ($Al_2O_3$), GaN, SiC, ZnO, Si, GaP, InP, $Ga_2O_3$ and GaAs. A concave-convex pattern may be formed on the substrate 101.

A nitride semiconductor is grown on the substrate 101. Herein, growth equipment may use an electron beam evaporator or a dual-type thermal evaporator, and the nitride semiconductor may be formed by electron beam evaporator, Physical Vapor Deposition (PVD), Chemical Vapor Deposition (CVD), Plasma Laser Deposition (PLD), dual-type thermal evaporator, sputtering and Metal Organic Chemical Vapor Deposition (MOCVD), but it is not limited thereto.

A buffer layer or/and an undoped semiconductor layer may be formed with the compound semiconductor of group II to group VI elements on the substrate 101, and may be removed after a thin film grows. The buffer layer decreases lattice constant difference between the substrate 101 and the nitride semiconductor, and the undoped semiconductor layer may be formed of GaN that is not intentionally doped. A semiconductor for extracting the dislocation defect of a compound semiconductor or light may be formed on the substrate 101, but it is not limited thereto.

The plurality of compound semiconductor layers 135 are formed on the substrate 101, and the plurality of compound semiconductor layers 135 may serve as a light emitting structure. The plurality of compound semiconductor layers 135 include a first conductive semiconductor layer 110, an active layer 120 and a second conductive semiconductor layer 130. The active layer 120 is formed on the first conductive semiconductor layer 110, and the second conductive semiconductor layer 130 is formed on the active layer 120.

The first conductive semiconductor layer 110, the active layer 120 and the second conductive semiconductor layer 130 may be formed of the compound semiconductor of group III-V elements, and each of the layers 110, 120 and 130 may be formed to have at least one layer or multiple-layer.

The first conductive semiconductor layer 110 may be formed as a semiconductor layer on which a first conductive dopant is doped, and the second conductive semiconductor layer 130 may be formed as a semiconductor layer on which a second conductive dopant is doped. As an N-type semiconductor layer, the first conductive semiconductor layer 110 selectively includes compound semiconductors such as GaN, InN, AlN, InGaN, AlGaN, InAlGaN and AlInN. The first conductive dopant includes an N-type dopant such as Si, Ge, Sn, Se and Te. As a P-type semiconductor layer, the second conductive semiconductor layer 130 selectively includes compound semiconductors such as GaN, InN, AlN, InGaN, AlGaN, InAlGaN and AlInN. The second conductive dopant may include a P-type dopant such as Mg.

Another semiconductor layer may be formed on or/and under each of the layers 110, 120 and 130, but it is not limited thereto. A third conductive semiconductor layer having a opposite polarity to that of the second conductive semiconductor layer 130 is formed on the second conductive semiconductor layer 130, and the third conductive semiconductor layer (not shown) may be formed as an N-type semiconductor layer or a P-type semiconductor layer. Moreover, the plurality of compound semiconductor layers 135 may include any one of an N-P junction structure, a P-N junction structure, an N-P-N junction structure and a P-N-P junction structure.

An inner region 142 on the second conductive semiconductor layer 130 is opened, and a channel layer 140 may be formed at the outer perimeter of the second conductive semiconductor layer 130. The channel layer 140 may be formed of a conductive material or an insulating material which selectively includes an oxide and a nitride, and may be formed of a material that is selected from among ITO, IZO, IZTO, IAZO, IGZO, IGTO, AZO, ATO, GZO, $SiO_2$, $SiO_x$, $SiO_xN_y$, $Si_3N_4$, $Al_2O_3$ and $TiO_2$. The channel layer 140 may not be formed.

The channel layer 140 improves adhesiveness to the second conductive semiconductor layer 130, thereby minimizing exfoliation. Moreover, when the channel layer 140 is formed of an insulating material, it can separate the second conductive semiconductor layer 130 and a metal material such as a conductive support member. When the channel layer 140 is formed of a conductive material, it improves current flow, thereby decreasing a driving voltage.

Figure 7:
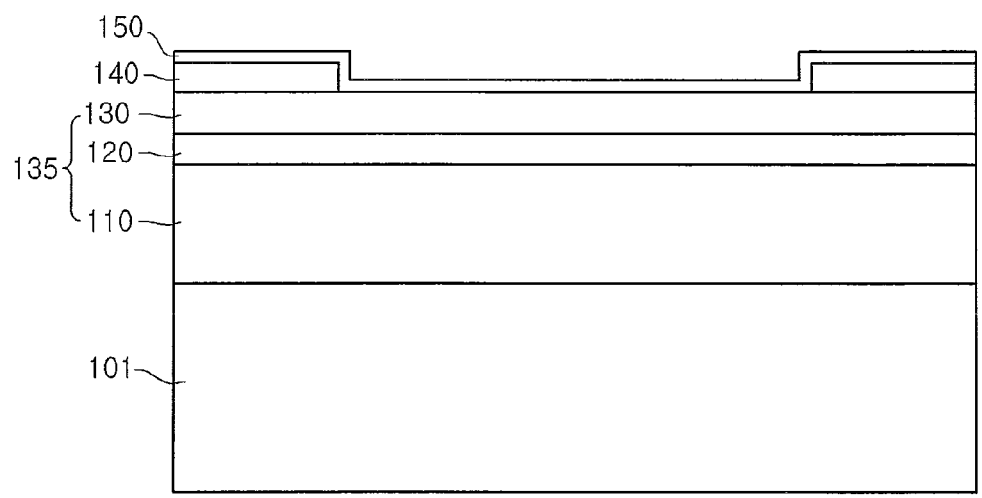

Referring to FIG. 7, an electrode layer 150 may be formed at a portion or entirety of a region on the second conductive semiconductor layer 130. The electrode layer 150 may include a material having at least one characteristic of a seed metal, an ohmic metal and a reflection metal. The electrode layer 150, for example, may be formed of at least one of Ag, Ni, Al, Rh, Pd, Ir, Ru, Mg, Zn, Pt, Au, Hf and a material consisting of their selective combination. The electrode layer 150 may be extended to a portion or entire upper surface of the channel layer 140.

Figure 8:
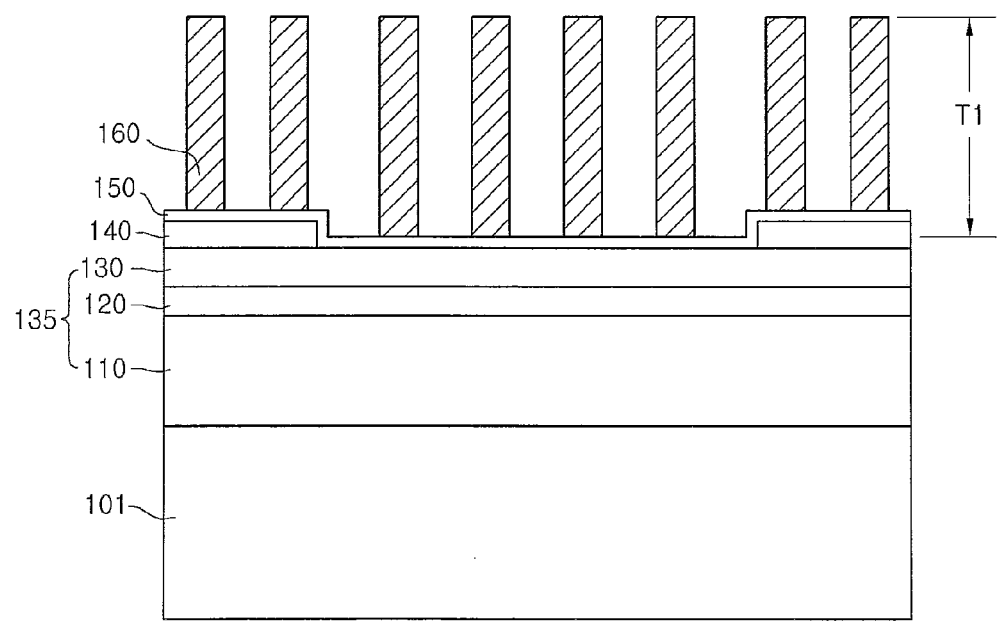

Referring to FIG. 8, a first buffer member 160 is formed on the electrode layer 150. The first buffer member 160 may be formed in any one of sputtering, electron beam evaporation, CVD and Plasma Enhanced Chemical Vapor Deposition (PECVD). The first buffer member 160 may be formed in certain patterns, which are spaced at certain intervals, on the electrode layer 150. The first buffer member 160 may be formed by selectively using a material having certain stiffness, a refractory material and an insulating material, for example, may be formed of any one of $SiO_2$, $Si_3N_4$, $Al_2O_3$, $TiO_2$, $SiO_x$, $SiN_x2$, $SiN_x$, $SiO_xN_y$, and a photoresist.

The height 'T1' of the first buffer member 160 may be formed to about 10 μm to about 300 μm. Herein, the height 'T1' of the first buffer member 160 may be formed to a certain length from the upper surface of the electrode layer 140 that is disposed on the second conductive semiconductor layer 130. The lower surface of the first buffer member 160 may be disposed at different planes.

The pattern of the first buffer member 160 may include the pattern types as illustrated FIGS. 2 to 5. For example, the pattern may be formed in a dot matrix type using a pillar shape, a stripe type, a type having a plurality of domed shapes, a type having a plurality of concentric circle shapes, or a pattern type (for example, a cross shape or a matrix type) that is crossed at least one time. These pattern types may be modified.

Figure 9:
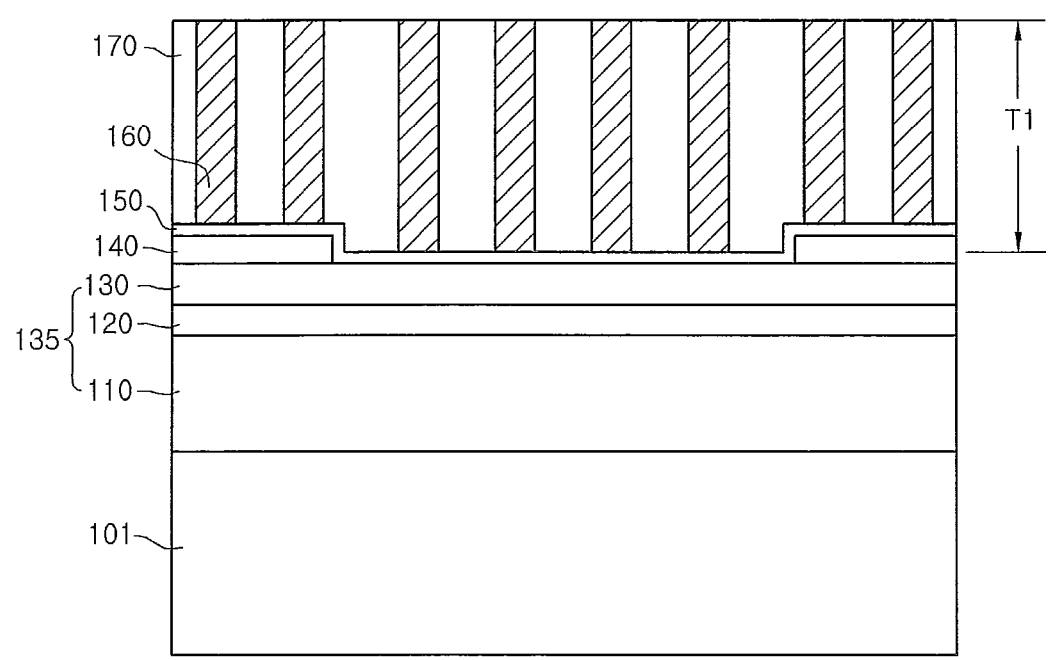

Referring to FIG. 9, a conductive support member 170 may be formed on the electrode layer 150. The conductive support member 170 is formed in an electro plating process, and may be formed of a material such as Cu, Au, Ni and Mo.

The first buffer member 160 is disposed at the inner region of the conductive support member 170. The first buffer member 160 has a type in which it perpendicularly passes through the conductive support member 170, and is arranged at certain intervals and in a horizontal direction.

The thickness of the conductive support member 170 may be to the same height 'T1' as that of the first buffer member 160. The conductive support member 170 and the first buffer member 160 can provide electrical reliability when an upper surface, i.e., a base surface in a chip becomes a flat plane.

Herein, the upper end of the conductive support member 170 and the upper end of the first buffer member 160 may be disposed at the same plane or different planes.

Figure 10:
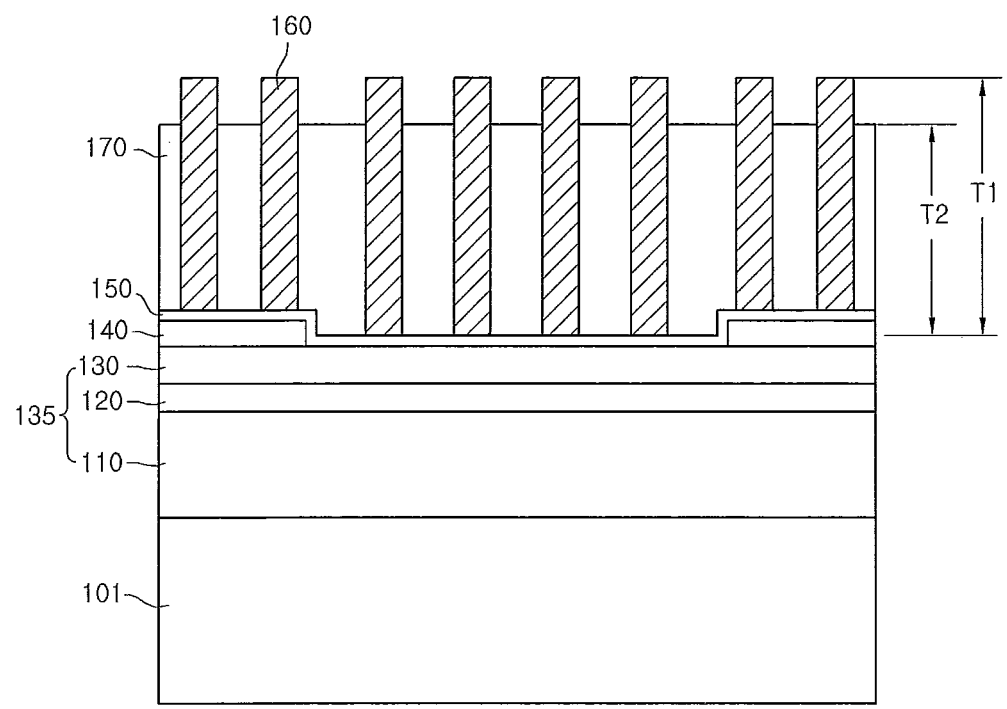
Figure 11:
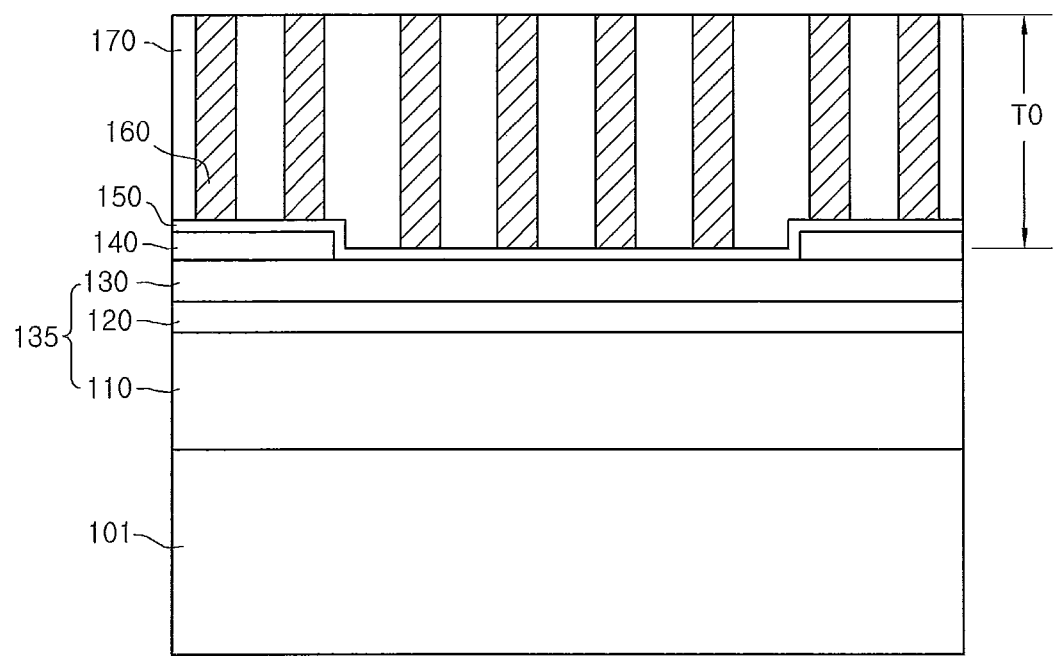

As illustrated in FIG. 10, when the height 'T1' of the first buffer member 160 is greater than the thickness 'T2' of the conductive support member 170, the conductive support member 170 and the first buffer member 160 are cut to have the thickness 'T2'. Alternatively, as illustrated in FIG. 11, the conductive support member 170 and the first buffer member 160 are cut to have a thickness 'T0' less than the thickness of the conductive support member 170 or may be planarized in a polishing process.

Figure 12:
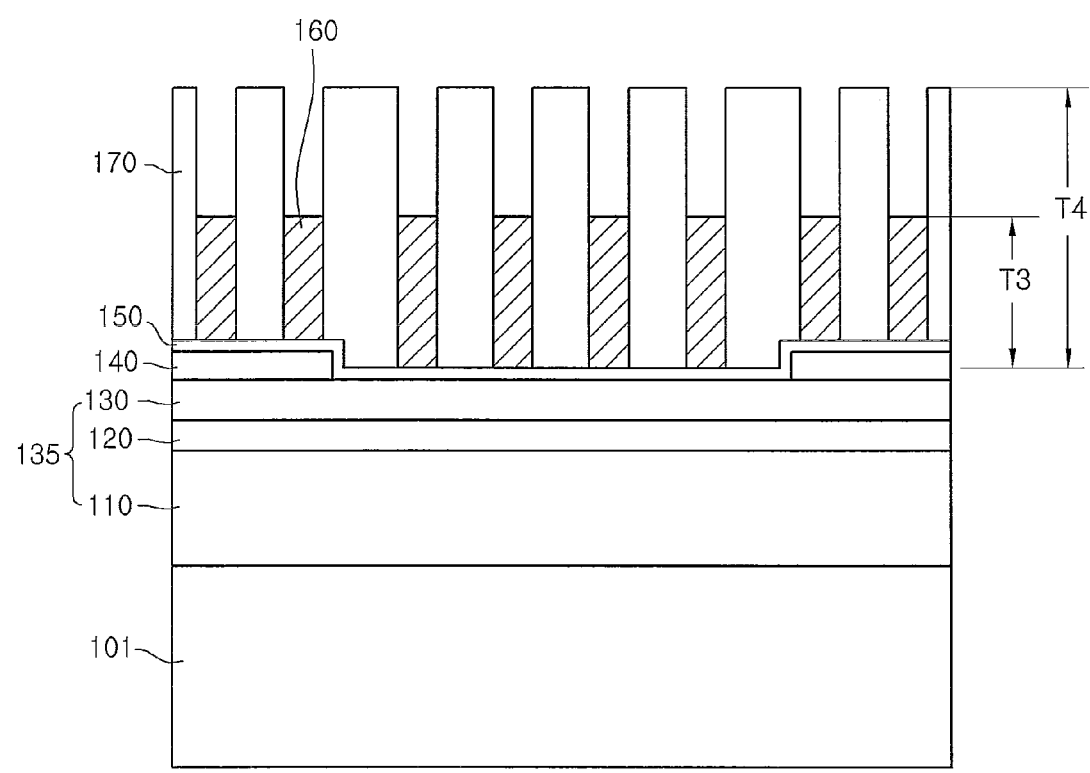

As illustrated in FIG. 12, when the thickness 'T4' of the conductive support member 170 is greater than the height 'T3' of the first buffer member 160, the conductive support member 170 is cut to have a thickness equal to or less than the height 'T3' of the first buffer member 160 or may be planarized in a polishing process.

Figure 13:
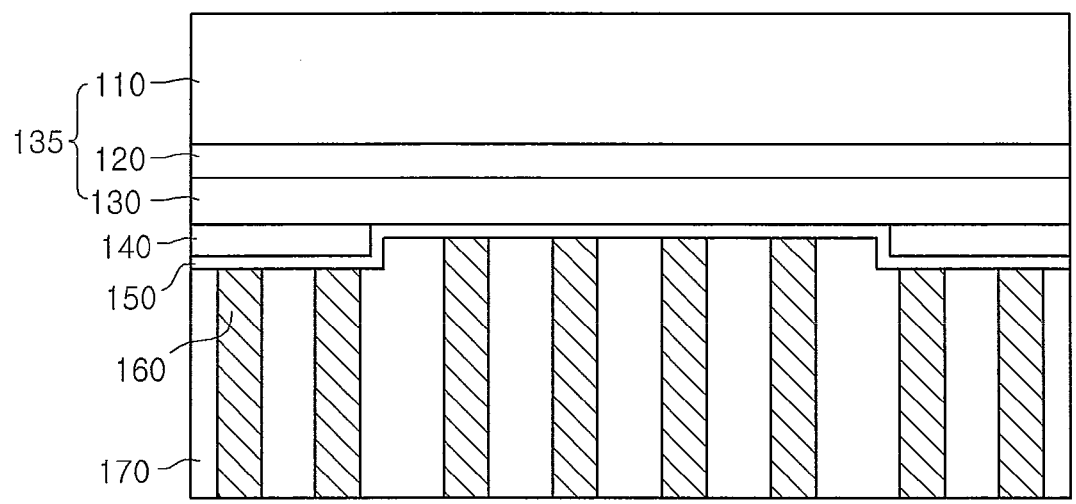

Referring to FIGS. 6 and 13, when the conductive support member 170 is formed, the substrate (101 in FIG. 9) is removed by a physical or/and chemical removing process. A process of removing the substrate (110 in FIG. 10) may use a Laser Lift Off (LLO) process that radiates laser, having a wavelength of a certain region, to the substrate 101, and separates the substrate 101.

When another semiconductor layer (for example, a buffer layer) is formed between the substrate 101 and the first conductive semiconductor layer 110, the substrate 101 may be separated by removing the buffer layer with a wet etching liquid. A process using an Inductively coupled Plasma/Reactive Ion Etching (ICP/RCE) process may be performed on the surface of the first conductive semiconductor layer 110 from which the substrate 101 has been removed.

Figure 14:
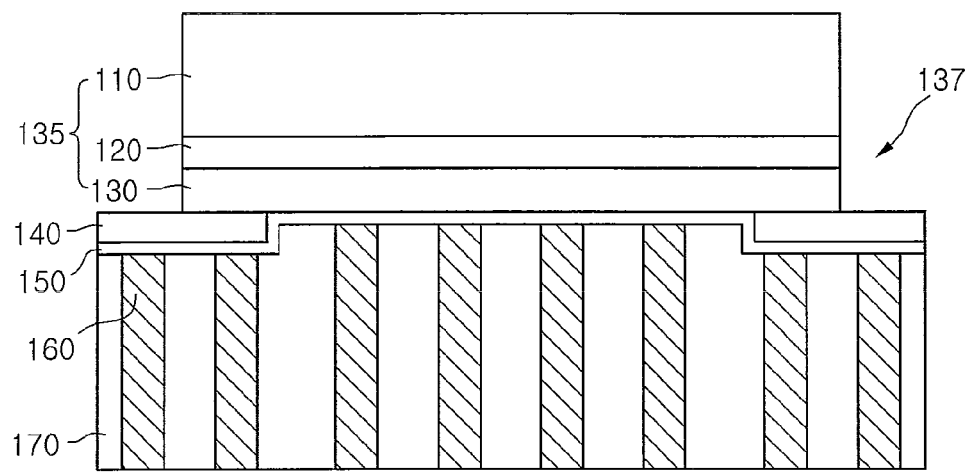

Referring to FIGS. 13 and 14, a chip boundary region (i.e., a channel region) is removed by isolation etching, and thereby the channel spacer 137 of the plurality of compound semiconductor layers 135 is formed. The outer side of the channel layer 140 is exposed through the channel spacer 137.

Figure 15:
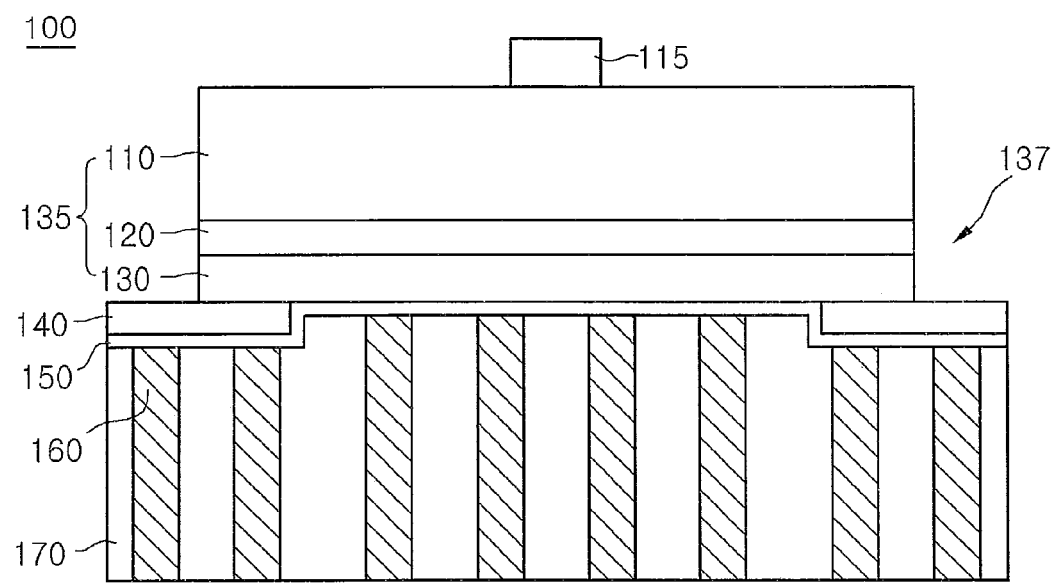

Referring to FIG. 15, an electrode having a certain pattern is formed on the first conductive semiconductor layer 110. Herein, a process of forming the electrode 115 may be performed before/after the isolation etching or may be performed after a chip is separated, but it is not limited thereto. The electrode 115 may include at least one electrode pad, and the pattern of a branch structure for current spreading may be connected to the electrode pad.

A structure for improving light extraction efficiency may be formed at the upper surface of the first conductive semiconductor layer 110.

Subsequently, the structure is separated through a process such as breaking or/and cutting in the size of chip unit.

In the light emitting device 100, a wire may be bonded to the electrode 115. When the wire is bonded at the lower portion of a device, the first buffer member 160 absorbs or supports a chip from an impulse that is given to the electrode 115. The first buffer member 160 can prevent a wafer from being bent, and moreover, can remove limitations in which the plurality of compound semiconductor layers 135 are bent. Furthermore, the first buffer member 160 prevents the LED chip from being bent by heat that is generated in the LED chip.

Figure 16:
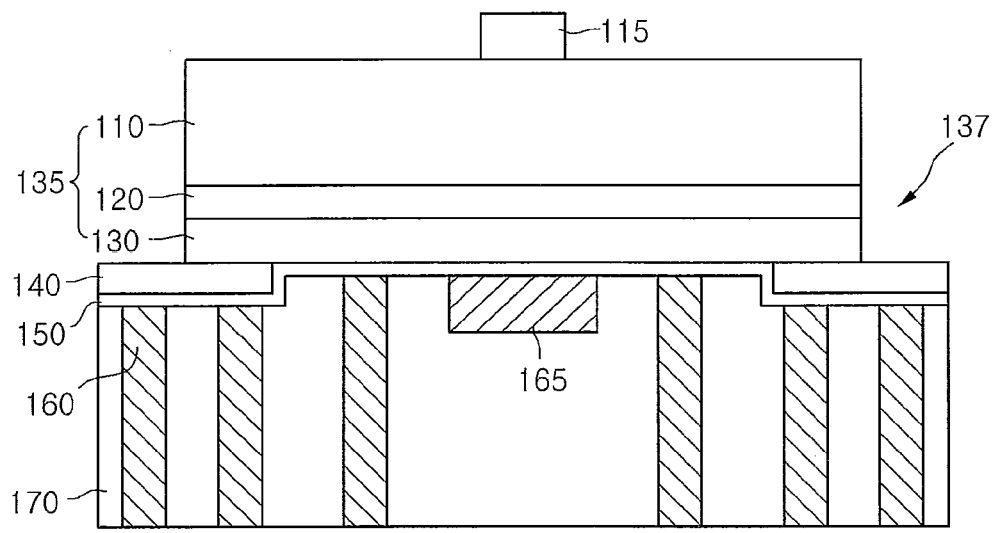
FIG. 16 is a side-sectional view illustrating a semiconductor light emitting device according to another embodiment.

FIG. 16 is a side-sectional view illustrating a semiconductor light emitting device according to another embodiment. In the following description on another embodiment, the same elements as those of the above-described embodiment will reference one embodiment.

Referring to FIG. 16, a semiconductor light emitting device 100A according to another embodiment includes a first conductive semiconductor layer 110, an active layer 120, a second conductive semiconductor layer 130, a channel layer 140, an electrode layer 150, a first buffer member 160, a second buffer member 165, a conductive support member 170, and an electrode 115.

The first buffer member 160, the second buffer member 165 and the conductive support member 170 may be formed under the electrode layer 150.

The first buffer member 160 is formed in a certain pattern at the bottom of the electrode layer 150. At least one portion of the second buffer member 165 may be disposed to perpendicularly overlap with the electrode 115. The first buffer member 160 may be formed in the pattern shapes (which are as illustrated FIGS. 2 to 5) at a region other than the second buffer member 165, in the conductive support member 170.

The second buffer member 165 is formed for protecting an LED chip from a direct impulse, and is formed in correspondence with the formed position of the electrode 115. The second buffer member 165 may selectively include an insulating material, a refractory metal and a conductive metal of high stiffness, for example, may be selected from among materials such as $SiO_2$, $Si_3N_4$, $Al_2O_3$, $TiO_2$, $SiO_x$, $SiN_x2$, $SiN_x$, $SiO_xN_y$, a photoresist, W and Mo. The second buffer member 165 may be formed to have at least a thickness of about 1 μm. For example, the second buffer member 165 may be formed to a thickness of about 1 μm to about 10 μm.

The second buffer member 165 may be formed to have the same number as the number of electrodes or patterns, or may be formed in the same pattern. The electrode 115 includes an electrode pad. The second buffer member 165 supports the lower portion of a chip from an impulse that is given by the electrode 115, and suppresses the bending of the semiconductor layers 110, 120 and 130. Accordingly, the second buffer member 165 can improve limitations in which a finally-completed LED chip is broken or exfoliated and thereby chip characteristic is degraded.

Figure 17:
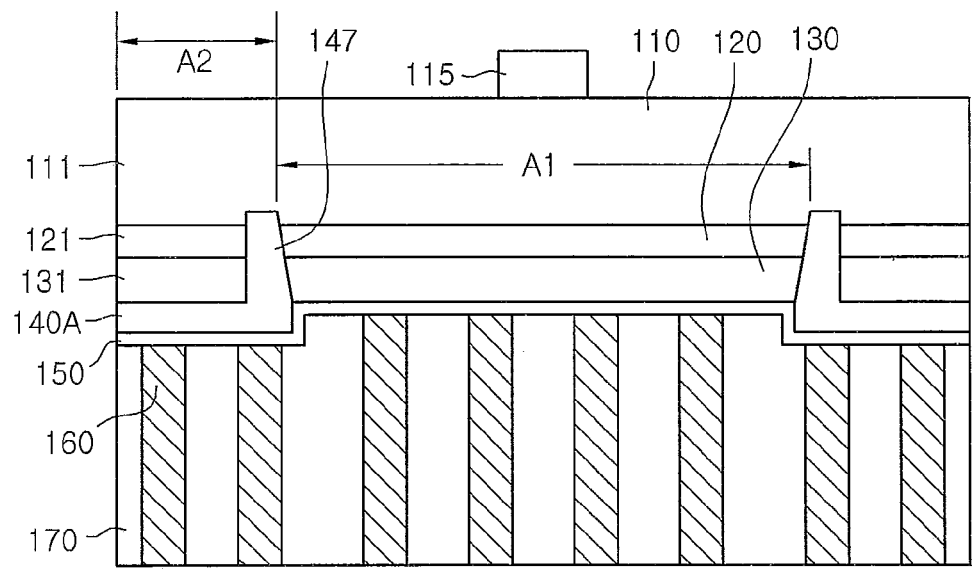
FIG. 17 is a diagram illustrating a semiconductor light emitting device according to another embodiment.

FIG. 17 is a diagram illustrating a semiconductor light emitting device according to another embodiment. In the following description on another embodiment, the same elements as those of the above-described embodiments will reference the embodiments.

Referring to FIG. 17, a semiconductor light emitting device 100B according to another embodiment includes a first conductive semiconductor layer 110, an active layer 120, a second conductive semiconductor layer 130, a channel layer 140A, an electrode layer 150, a first buffer member 160, a conductive support member 170, and an electrode 115.

The channel layer 140A is formed in a frame shape at the lower-surface perimeter of the second conductive semiconductor layer 130. An insulating protrusion 147 is formed at the channel layer 140A, and the insulating protrusion 147 electrically deactivates the outer sides 111, 121 and 131 of the plurality of compound semiconductor layers 110, 120 and 130. The insulating protrusion 147 may be formed in a belt shape, a ring shape or a frame shape.

The channel layer 140A is formed of an insulating material, for example, $SiO_2$, $SiO_x$, $SiO_xN_y$, $Si_3N_4$ and $Al_2O_3$. The insulating protrusion 147 divides the inner region 'A1' and outer region 'A2' of the plurality of compound semiconductor layers 110, 120 and 130. The inner region 'A1' is an active region, and the outer region 'A2' is an inactive region. Accordingly, the compound semiconductor layers 110, 120 and 130 that are disposed at the active region enable the semiconductor light emitting device to normally operate although each of the layers of outer walls becomes short due to moisture.

The formed position of the insulating protrusion 147 may be changed to the outer wall of a chip or a position internal to the outer wall. The insulating protrusion 147 can enhance the adhesive strength between the compound semiconductor layers 110, 120 and 130 and the channel 140A.

Figure 18:
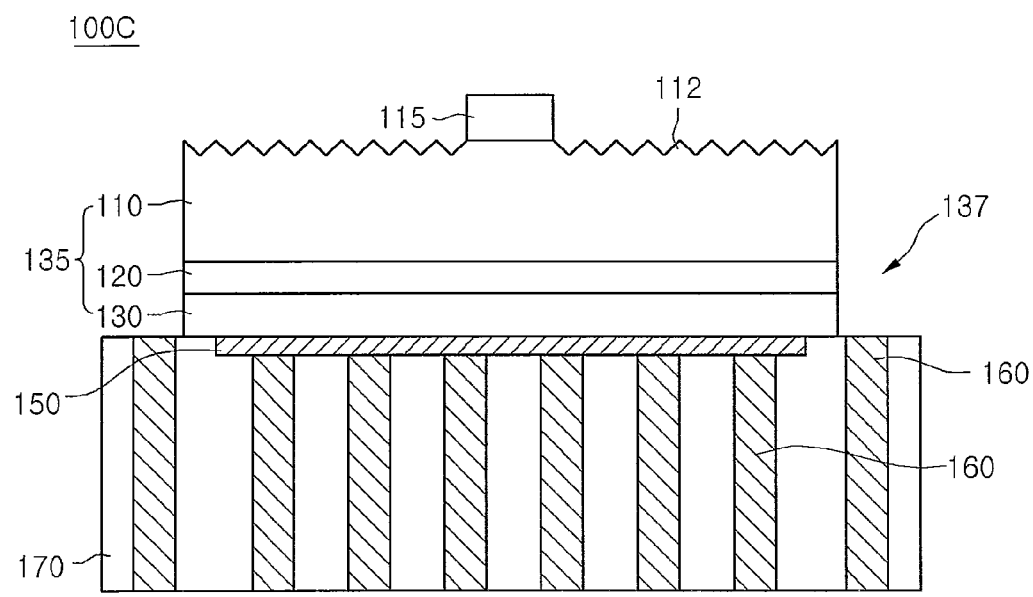
FIG. 18 is a diagram illustrating a semiconductor light emitting device according to another embodiment.

FIG. 18 is a diagram illustrating a semiconductor light emitting device according to another embodiment. In the following description on another embodiment, the same elements as those of the above-disclosed embodiments will reference the embodiments.

Referring to FIG. 18, a semiconductor light emitting device 100C according to another embodiment includes a first conductive semiconductor layer 110, an active layer 120, a second conductive semiconductor layer 130, an electrode layer 150, a first buffer member 160, a conductive support member 170, and an electrode 115.

A certain roughness 112 may be formed at the upper surface of the first conductive semiconductor layer 110, but the pattern of the roughness 112 is not limited to that of FIG. 18.

A channel layer (140 of FIG. 1) may not be formed under the second conductive semiconductor layer 130, or the electrode layer 150 may be formed. The conductive support member 170 and the first buffer member 160 may be formed on the electrode layer 150 to have the same thickness.

The electrode layer 150 is formed at the inner region of the second conductive semiconductor layer 130, and may be formed not to be exposed to the channel spacer 137 of the compound semiconductor layer 135. Accordingly, a portion of the first buffer member 160 may be formed under the second conductive semiconductor layer 130. At least one of the first buffer member 160 may be exposed to the outer side of the plurality of compound semiconductor layers 135.

Accordingly, the first buffer member 160 can prevent an LED chip from being bent under the second conductive semiconductor layer 130 by an external impulse or heat.

Figure 19:
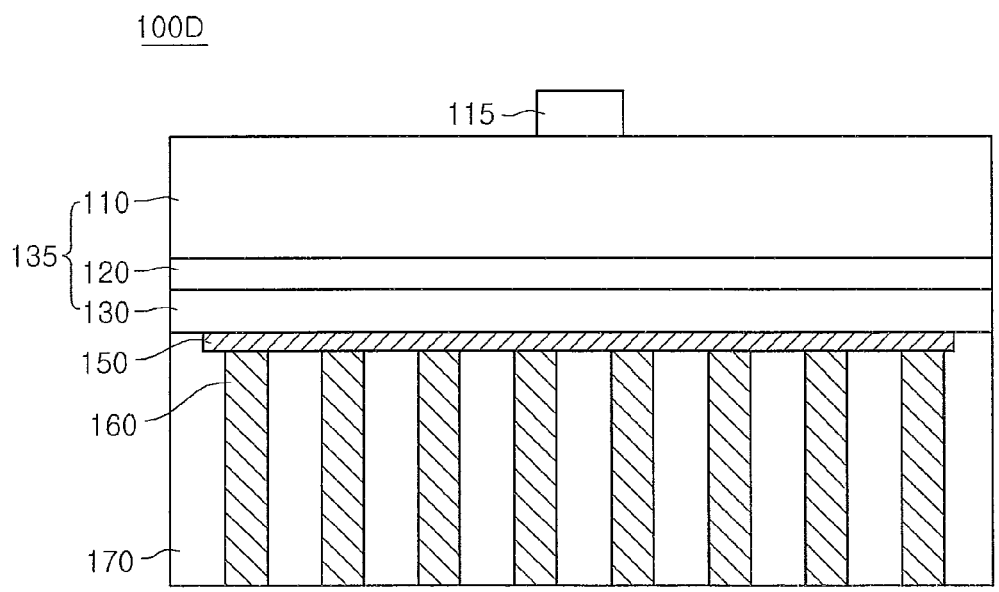
FIG. 19 is a diagram illustrating a semiconductor light emitting device according to another embodiment.

FIG. 19 is a diagram illustrating a semiconductor light emitting device according to another embodiment. In the following description on another embodiment, the same elements as those of the above-disclosed embodiments will reference the embodiments.

Referring to FIG. 19, a semiconductor light emitting device 100D according to another embodiment includes a first conductive semiconductor layer 110, an active layer 120, a second conductive semiconductor layer 130, an electrode layer 150, a first buffer member 160, a conductive support member 170, and an electrode 115.

In the semiconductor light emitting device 100D, a cutting spacer may not be formed at the outer walls of a plurality of compound semiconductor layers 135, and the compound semiconductor layer 135 and the conductive support member 170 may be formed to have the same diameter.

The above-disclosed embodiments may be selectively applied to another embodiment together with their independent feature. This may be modified in the technical scope of each of the above-disclosed embodiments. As the feature of the above-disclosed embodiments, moreover, a feature in which a first buffer member is disclosed may be applied to the substrate of a lateral semiconductor light emitting device as well as the substrate of a vertical semiconductor light emitting device.

Figure 20:
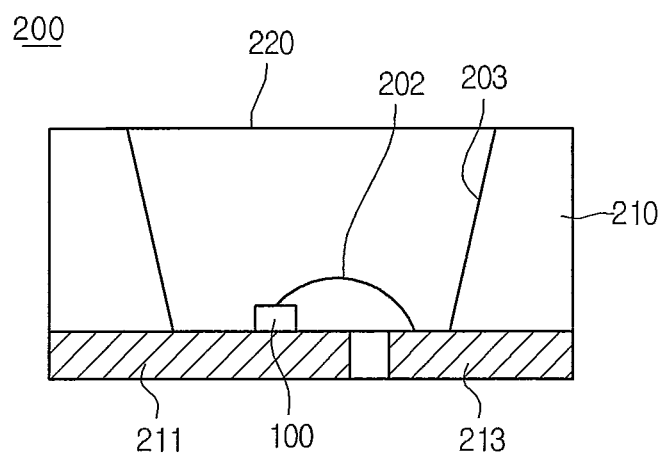
FIG. 20 is a side-sectional view illustrating a light emitting device package according to another embodiment.

FIG. 20 is a side-sectional view illustrating a light emitting device package according to another embodiment.

Referring to FIG. 20, a light emitting device package 200 according to another embodiment includes a body 210, first and second lead electrodes 211 and 213 disposed at the body 210, a light emitting device 100 according to embodiment(s), and a molding member 220 surrounding the light emitting device 100. Herein, the light emitting device 100 is disposed at the body 210 and is electrically connected to the first and second lead electrodes 211 and 213.

The body 210 may be formed of include silicon, plastic or metal. A cavity 205 having an inclined surface may be formed around the light emitting device 100.

The first and second lead electrodes 211 and 213 are electrically disconnected, and supply a power source to the light emitting device 100. Moreover, the first and second lead electrodes 211 and 213 reflect light that is produced from the light emitting device 100, thereby enhancing light efficiency. The first and second lead electrodes 211 and 213 may release heat, which is produced from the light emitting device 100, to the outside.

The light emitting device 100 may be disposed on the body 210, or may be disposed on the first lead electrode 211 or the second lead electrode 213.

The light emitting device 100 may be electrically connected to the second lead electrode 213 through a wire 202, and may be connected to the first lead electrode 211 in a die bonding type.

The molding member 220 surrounds the light emitting device 100, thereby protecting the light emitting device 100. Moreover, a phosphor is included in the molding member 220, and it can vary the wavelength of light that is emitted from the light emitting device 100.

The semiconductor light emitting device according to the embodiment(s) is connected to the first and second lead electrodes and is packaged, thereby being used as the light sources of pointing devices, illumination devices like as a lamp and a streetlight, light unit, lighting devices and display devices. Moreover, each of the embodiments is not limited to it, and may be selectively applied to but is not limited to the above-described other embodiment.

The method of fabricating the semiconductor light emitting device according to embodiments includes forming a plurality of compound semiconductor layers including an active layer and a second conductive semiconductor layer; forming an electrode layer on the second conductive semiconductor layer; forming a plurality of first buffer members having the type of patterns spaced apart, on the electrode layer; forming a conductive support member between the first buffer members, on the electrode layer.

The semiconductor light emitting device according to embodiments can protect the light emitting structure from an external impulse. The semiconductor light emitting device according to embodiments can prevent the characteristic of an LED chip from being degraded by an impulse. The semiconductor light emitting device according to embodiments can minimize the bending of the LED chip due to heat.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a plurality of compound semiconductor layers comprising a first conductive semiconductor layer, an active layer and a second conductive semiconductor layer;
an electrode layer under the plurality of compound semiconductor layers;
a channel layer selectively including an oxide and a nitride between the plurality of compound semiconductor layers and the electrode layer;
a conductive support member under the electrode layer; and
a first buffer member embedded to be spaced apart, in the conductive support member,
wherein the first buffer member is arranged in the conductive support member to have a height equal to or less than a thickness of the conductive support member, and
wherein the first buffer member is formed to have different heights.

2. The semiconductor light emitting device according to claim 1, wherein the first buffer member comprises a material having a thermal expansion coefficient less than a thermal expansion coefficient of the conductive support member.

3. The semiconductor light emitting device according to claim 1, wherein the first buffer member comprises any one of $SiO_2$, $Si_3N_4$, $Al_2O_3$, $TiO_2$, $SiO_x$, $SiN_x2$, $SiN_x$, $SiO_xN_y$, and a photoresist.

4. The semiconductor light emitting device according to claim 1, wherein the first buffer member comprises at least one of a dot matrix pattern, a stripe pattern, a plurality of domed patterns, a plurality of concentric circle patterns, and a cross-type matrix pattern.

5. The semiconductor light emitting device according to claim 1, wherein the first buffer member is arranged at regular intervals or irregular intervals.

6. The semiconductor light emitting device according to claim 1, comprising an electrode connected to the first conductive semiconductor layer.

7. The semiconductor light emitting device according to claim 1, wherein the conductive support member comprises at least one of Cu, Au, Ni and Mo.

8. The semiconductor light emitting device according to claim 1, wherein the first buffer member is formed to about 10 µm to about 300 µm from a bottom of the electrode layer.

9. The semiconductor light emitting device according to claim 1, wherein the channel layer is formed in a frame shape at the lower-surface perimeter of the second conductive semiconductor layer and the channel layer comprises an insulating protrusion into the plurality of compound semiconductor layers.

10. A semiconductor light emitting device, comprising:
a plurality of compound semiconductor layers comprising a first conductive semiconductor layer, an active layer and a second conductive semiconductor layer;
an electrode layer disposed under the plurality of compound semiconductor layers, and connected to the second conductive semiconductor layer;
an electrode connected to the first conductive semiconductor layer;
a conductive support member under the electrode layer; and
a first buffer member arranged in the conductive support member to have a height equal to or less than a thickness of the conductive support member,
wherein the first buffer member is formed to have different heights.

11. The semiconductor light emitting device according to claim 10, comprising a channel layer selectively comprising a conductive material and an insulating material between the plurality of compound semiconductor layers and the electrode layer.

12. The semiconductor light emitting device according to claim 10, wherein the plurality of compound semiconductor layers comprise a third conductive semiconductor layer having a opposite polarity to a polarity of the second conductive semiconductor layer, under the second conductive semiconductor layer.

13. The semiconductor light emitting device according to claim 10, comprising a second buffer member disposed under the electrode layer to perpendicularly overlap with the electrode, wherein the second buffer member selectively comprises $SiO_2$, $Si_3N_4$, $Al_2O_3$, $TiO_2$, $SiO_x$, $SiN_x2$, $SiN_x$, $SiO_xN_y$, a photoresist, W and Mo.

14. The semiconductor light emitting device according to claim 10, wherein the first buffer member comprises at least one of a dot matrix pattern, a stripe pattern, a plurality of domed patterns, a plurality of concentric circle patterns, and a cross-type matrix pattern.

15. The semiconductor light emitting device according to claim 10, comprising a roughness formed at a top of the first conductive semiconductor layer.

16. The semiconductor light emitting device according to claim 10, wherein a portion of an upper end of the first buffer member is exposed to an outer side of the compound semiconductor layers.

17. The semiconductor light emitting device according to claim 10, wherein the electrode is disposed on an upper surface of the plurality of upper compound semiconductor layers, further comprising a second buffer member disposed under the electrode layer perpendicularly overlapping with the electrode, and wherein the second buffer member comprises a metal.

18. The semiconductor light emitting device according to claim 11, wherein the channel layer is formed of an insulating material and projected to the first conductive semiconductor layer of the compound semiconductor layers, and comprises an insulating protrusion deactivating an outer region of the active layer.

19. A light emitting device package comprising:
a body;
a plurality of lead electrodes in the body;
a light emitting device electrically connected to the plurality of lead electrodes; and
a molding member covering the light emitting device, wherein the light emitting device comprises:
a plurality of compound semiconductor layers comprising a first conductive semiconductor layer, an active layer and a second conductive semiconductor layer;
an electrode layer under the plurality of compound semiconductor layers; a conductive support member under the electrode layer; and
a first buffer member embedded to be spaced apart, in the conductive support member.

* * * * *